United States Patent [19]

Hatano

[11] Patent Number: 5,057,714
[45] Date of Patent: Oct. 15, 1991

[54] BICMOS INTEGRATED CIRCUIT DEVICE UTILIZING SCHOTTKY DIODES

[75] Inventor: Tsutomu Hatano, Tokyo, Japan

[73] Assignee: NEC Corporation, Japan

[21] Appl. No.: 530,236

[22] Filed: May 29, 1990

[30] Foreign Application Priority Data

May 30, 1989 [JP] Japan ................................. 1-138671

[51] Int. Cl.$^5$ ........................................... H03K 19/02
[52] U.S. Cl. ................................................ 307/446
[58] Field of Search ................ 307/446, 570, 475, 264

[56] References Cited

U.S. PATENT DOCUMENTS

| | | | |
|---|---|---|---|
| 4,760,293 | 7/1988 | Hebenstreit | 307/446 |
| 4,839,540 | 6/1989 | Ueno | 307/446 |
| 4,847,522 | 7/1987 | Fuller et al. | 307/446 |
| 4,866,304 | 9/1989 | Yu | 307/446 |
| 4,908,794 | 3/1990 | Yamaguchi | 307/446 |

*Primary Examiner*—David Hudspeth
*Assistant Examiner*—Andrew Sanders
*Attorney, Agent, or Firm*—Laff, Whitesel, Conte & Saret

[57] ABSTRACT

The invention relates to a BiCMOS or bipolar/CMOS hybrid integrated circuit device which has both bipolar transistors and MOS transistors on the same semiconductor substrate. An output circuit of the device having a push-pull configuration is constructed of two bipolar transistors Darlington-connected with each other arranged at the upper push-side and a MOS transistor arranged at the lower pull-side. A Schottky diode is interposed between the power supply line and the Darlington-connected bipolar transistors, thereby preventing the flow of currents from an output node into the output circuit. The output circuit also includes a clamping circuit of a Schottky diode for preventing the output bipolar transistor from being saturated and, a discharging circuit of a Schottky diode and a resistor connected in series, for discharging the charges stored in the base of the same bipolar transistor. The output circuit is simple in its construction as compared with the conventional ones and can readily be connected to or disconnected from, for example, a bus line even when the bus line is in an active state.

6 Claims, 4 Drawing Sheets

BICMOS INTEGRATED CIRCUIT DEVICE UTILIZING SCHOTTKY DIODES

BACKGROUND OF THE INVENTION

The present invention relates to the so-called BiCMOS integrated circuit device having both bipolar transistors and metal-oxide-semiconductor field effect transistors (hereinafter referred to as "MOS transistor(s)") on the same semiconductor substrate and, more particularly, to those in which their characteristic features reside in an output circuit for performing a level shifting operation directly with respect to an external circuit.

In a typical conventional output circuit of a BiCMOS integrated circuit device, there are two bipolar transistors or a pair of CMOS (complementary MOS) transistors which constitute an output circuit having a push-pull configuration. The integrated circuit device having an output circuit consisting of two bipolar transistors can readily be connected to or disconnected from a bus line of an active state, to which a plurality of integrated circuit device are connected. However, the above circuit device has a defect in that the circuit construction is inevitably complicated. The reason for this is explained in detail later. Although, on the other hand, the integrated circuit device having an output circuit consisting of a pair of CMOS transistors can be organized to have a simpler construction as compared to that composed of the bipolar transistors, it cannot be connected to or disconnected from an active bus line easily.

SUMMARY OF THE INVENTION

It is, therefore, an object of the invention to provide an improved output circuit which is well-suited to be fabricated in a BiCMOS integrated circuit device.

It is another object of the invention to provide a BiCMOS integrated circuit device which not only has a simple circuit construction but also can readily be connected to or disconnected from a bus line even while the bus line is in an active state.

It is further object of the invention to provide a BiCMOS integrated circuit device which can include on the same semiconductor substrate a variety of output circuits whose driving capabilities and operating speeds are different from one another.

According to the present invention, there is provided a semiconductor integrated circuit device including bipolar transistors and MOS transistors on the same semiconductor substrate and having an output circuit formed of a push-pull configuration for performing a level shifting operation with respect to an external circuit, the output circuit comprising:

a first power supply line of a first potential;

a second power supply line of a second potential lower than the first potential;

a first output bipolar transistor and a second bipolar transistor Darlington-connected with each other, disposed at the push-side between the first power supply line and an output node;

a series circuit having a resistor and a Schottky diode, which circuit being disposed between the first power supply line and the Darlington-connected bipolar transistors for preventing the flow of currents from the output node;

a series circuit having a resistor and a Schottky diode connected across the base and the emitter of the first bipolar transistor for discharging the charges stored in the base of the same bipolar transistor;

a Schottky clamping diode connected across the base and the collector of the second bipolar transistor for preventing the first bipolar transistor from being saturated;

an output MOS transistor disposed at the pull-side between the output node and the second power supply line; and a control circuit for effecting the ON/OFF control of the Darlington-connected bipolar transistors and the output MOS transistor.

BRIEF DESCRIPTION OF THE DRAWINGS

The above and other objects, features and advantages of the present invention will be apparent from the following description of a preferred embodiment of the invention explained with reference to the accompanying drawings, in which.

PREFERRED EMBODIMENT OF THE INVENTION

Throughout the following explanation, similar reference symbols or numerals refer to the same or similar elements in all figures of the drawings.

For the purpose of assisting in the understanding of the present invention, a conventional output circuit of a BiCMOS integrated circuit device and problems existing therein will first be described by making reference to FIGS. 1 through 7 before the present invention is explained.

Figure 1:
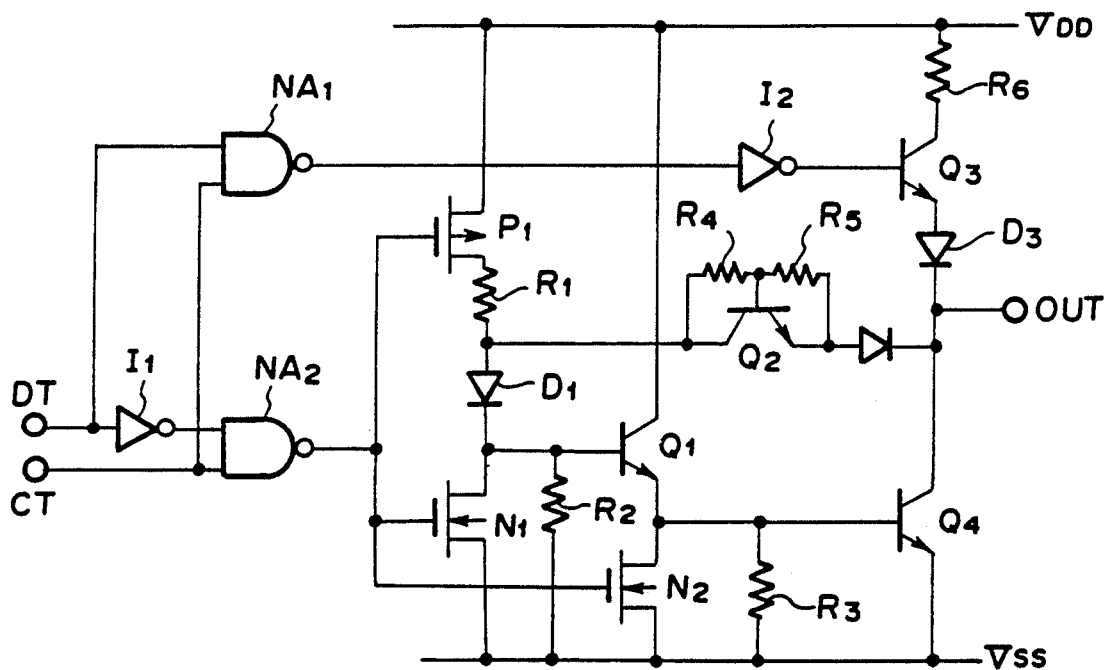
FIG. 1 is a circuit diagram of an example of a conventional output circuit for a BiCMOS integrated circuit device, composed of bipolar transistors.

FIG. 1 shows an example of a conventional output circuit constructed by bipolar transistors, of a BiCMOS integrated circuit device. In the drawings, reference symbols $Q_1$-$Q_4$ denote NPN-type bipolar transistors, symbols $R_1$-$R_6$ resistors, symbols $D_1$-$D_3$ diodes, symbol $P_1$ P-channel MOS transistor, symbols $N_1$-$N_2$ N-channel MOS transistors, symbols $I_1$-$I_2$ inverter circuits, and symbols $NA_1$-$NA_2$ denote two-input NAND gate circuits, respectively. Reference symbols DT, CT represent input nodes, symbol OUT represents an output node, and symbols $V_{DD}$ and $V_{SS}$ represent power supply lines, respectively.

Figure 2:
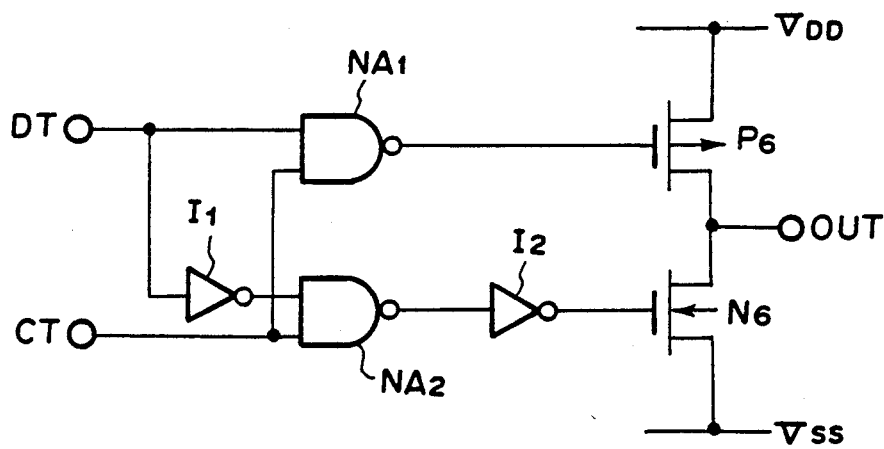
FIG. 2 is a circuit diagram of another example of a conventional output circuit composed of a pair of CMOS transistors.

FIG. 2 shows another example of an output circuit which is composed of a pair of CMOS transistors, that is, a P-channel MOS transistor $P_6$ and an N-channel MOS transistor $N_6$. This CMOS output circuit can also be installed in a BiCMOS integrated circuit device. The overall circuit shown in FIG. 2 performs the same function as achieved by that shown in FIG. 1, that is, three-state buffer operation.

Figure 3:
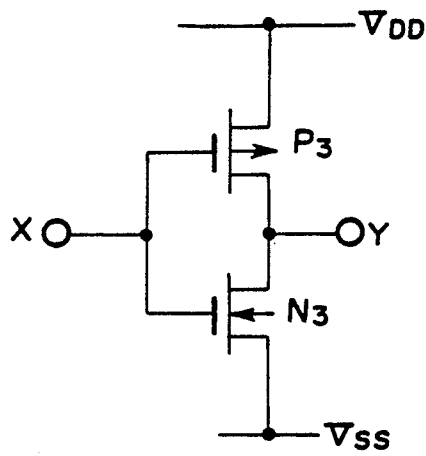
FIG. 3 is a circuit diagram of a CMOS inverter.
Figure 4:
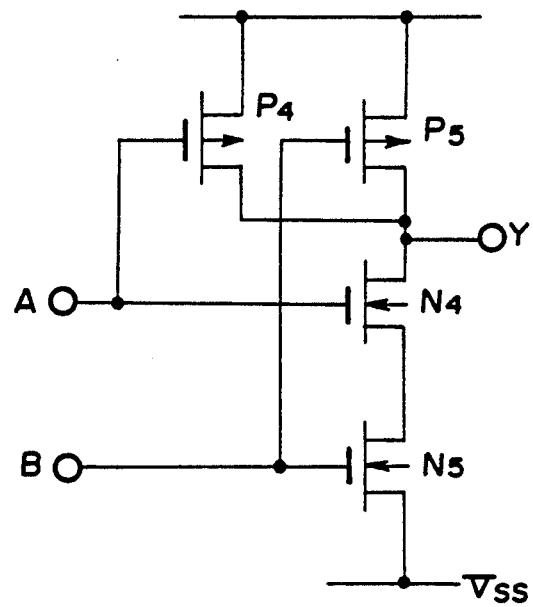
FIG. 4 is a circuit diagram of a two-input NAND gate circuit consisting of CMOS transistors.

FIG. 3 and FIG. 4 show respectively concrete circuit diagrams of the inverter circuits $I_1$, $I_2$ and the NAND gate circuits $NA_1$, $NA_2$ which are symbolically illustrated in FIGS. 1 and 2. A CMOS inverter circuit shown in FIG. 3 is constructed of a P-channel MOS transistor $P_3$ and an N-channel MOS transistor $N_3$. When the potential of an input node X becomes a low level, the P-channel MOS transistor $P_3$ turns "ON" and the N-channel MOS transistor $N_3$ turns "OFF", so that the potential of an output node Y becomes a high level. On the other hand, when the input node potential becomes a high level, the P-channel transistor $P_3$ turns "OFF" and the N-channel transistor $N_3$ turns "ON", so that the output node potential becomes a low level. In this manner, the CMOS inverter circuit shown in FIG. 3 delivers at the output node Y an output signal having a potential or phase inverted to that of an input signal applied to the input node X thereof. A two-input CMOS NAND circuit shown in FIG. 4 is constructed of two P-channel MOS transistors $P_4$, $P_5$ and also two N-channel MOS transistors $N_4$, $N_5$. When the potentials at both the input nodes A, B become a high level, both the N-channel transistors $N_4$, $N_5$ connected in series turn "ON" and both the P-channel transistors $P_4$, $P_5$ turn "OFF", so that the potential of the output node Y becomes a low level. On the other hand, when the potential of either one of or both of the input nodes A, B becomes a low level, both the N-channel transistors $N_4$, $N_5$ turn "OFF" and either one of or both of the P-channel transistors turn "ON", so that the potential at the output node Y becomes a high level.

Referring back to FIG. 1, the overall circuit illustrated is designed to operate between the upper power supply voltage $V_{DD}$ and the lower power supply voltage $V_{SS}$ and to effect such a level shifting operation as to deliver a level-shifted signal at the output node OUT after having received at its input nodes DT, CT input signals (high level = 5 V and low level = 0 V) forwarded from an internal circuit. Assuming that the upper power supply voltage $V_{DD}$ is 5 V and the lower voltage $V_{SS}$ is a ground level (= 0 V), the output of a TTL level is of a value approximately 3.5 V for a high level and 0.3 V for a low level.

Now, the operation of the circuit device shown in FIG. 3 will be explained hereinafter. When the input node CT as well as the input node DT are at a high level, an output level of the NAND circuit $NA_1$ becomes a low level and accordingly an output of the inverter $I_2$ becomes a high level, so that a series circuit of the bipolar transistor $Q_3$ and the diode $D_3$ turns "ON". On the other hand, an output of the inverter $I_1$ becomes a low level and accordingly an output level of the NAND circuit $NA_2$ becomes a high level, so that the P-channel transistor $P_1$ and the bipolar transistors $Q_1$, $Q_4$ change to "OFF" state. As a result, when both the input nodes DT and CT are at a high level, the output node OUT assumes a high level state. When the input node CT is at a high level while the input node DT is at a low level, the output of the NAND gates $NA_1$ and $NA_2$ become high and low levels respectively which levels are in opposite relation to those established in the foregoing condition, so that the output node OUT here assumes a low level state. When the input node CT is at a low level, since the output level of the NAND gate $NA_1$ becomes a high level irrespective of the level of the input node DT and accordingly the output level of the inverter $I_2$ becomes a low level, so that the series circuit of the bipolar transistor $Q_3$ and the diode $D_3$ turns to "OFF" state. The bipolar transistor $Q_4$ also turns to "OFF" state based on the high level of the NAND gate $NA_2$. As a result, in this condition where the input node CT is at a low level irrespective of the level of the input node DT, the output node OUT assumes a high impedance state. As explained hereinabove, the overall circuit shown in FIG. 3 functions as a TTL three-state buffer circuit.

In the conventional BiCMOS integrated circuit device having the bipolar transistors $Q_3$ and $Q_4$ as the output circuit, referred to above and shown in FIG. 3, it is necessary for the circuit device to have a discharge circuit formed by the N-channel MOS transistor $N_2$ and the resistor $R_3$ for discharging or removing the charges stored in the base of the output bipolar transistor $Q_4$, to have a discharge circuit formed by the N-channel MOS transistor $N_1$ and the resistor $R_2$ for discharging the charges stored in the base of the bipolar transistor $Q_1$, and to have a clamping circuit formed by a combination of the resistors $R_4$, $R_5$, the bipolar transistor $Q_2$ and the diode $D_2$ for preventing the output bipolar transistor $Q_4$ from being saturated due to an excess lowering of the low output state. Thus, a disadvantage in the conventional output circuit adopting the bipolar transistors as shown in FIG. 3 is that it requires some additional circuits composed by a number of elements, thereby making it difficult to reduce a chip area occupied thereby. However, the output circuit composed by the bipolar transistors has an advantageous feature in that it can readily be connected to or disconnected from an active bus line to which a number of other integrated circuit devices are connected.

Figure 5:
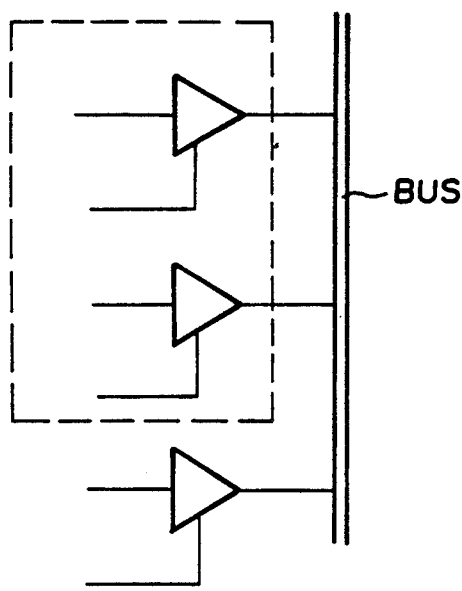
FIG. 5 is an explanatory view showing a connection of the output circuits to a common bus line.
Figure 6:
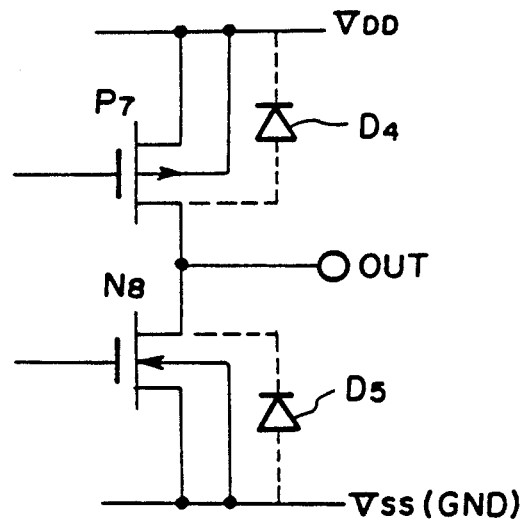
FIG. 6 is an explanatory circuit diagram showing existence of parasitic diodes and their influence on the output circuit.

As contrast with the output circuit shown in FIG. 1, the output circuit shown in FIG. 2 which is composed by a pair of CMOS transistors $P_6$, $N_6$ is simple in its circuit construction. However, this output circuit has a disadvantage in that it cannot be connected to or disconnected from the active bus line. When a plurality of integrated circuit devices are connected to a common bus line as shown in FIG. 5, there will be a situation where it is necessary to disconnect any of the integrated circuit devices from the bus line or to connect any additional integrated circuit device to the same bus line with the bus line being kept at an active state. In a case such as above, a problem arises in that, when power supplying to the circuit including a CMOS output circuit is interrupted (when a printed circuit board mounted thereon integrated circuits, for example, a portion indicated in dotted lines in FIG. 5, is electrically separated from the bus line), the potential of the bus line is dropped to a forward potential of a parasitic diode $D_4$ of a P-channel MOS transistor $P_7$ through the path passing from an output node OUT through the parasitic diode $D_4$ and further the path communicating between the power source line $V_{DD}$ and the ground line GND. As to an output circuit shown in FIG. 1, there exists no low impedance path from the output node OUT to the power supply line $V_{DD}$ and, therefore, the active connection or disconnection of the output circuit to the bus line is possible.

Figure 7:
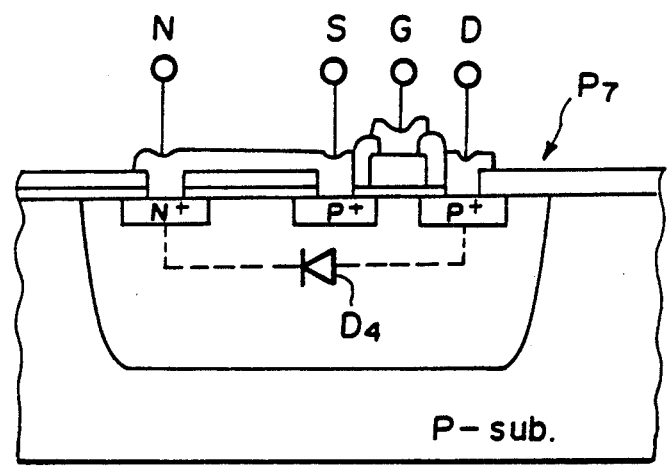
FIG. 7 is a sectional view of a P-channel MOS transistor.

FIG. 7 is a structural sectional view for showing existence of a parasitic diode $D_4$, by way of example, in the P-channel MOS transistor $P_7$.

Figure 8:
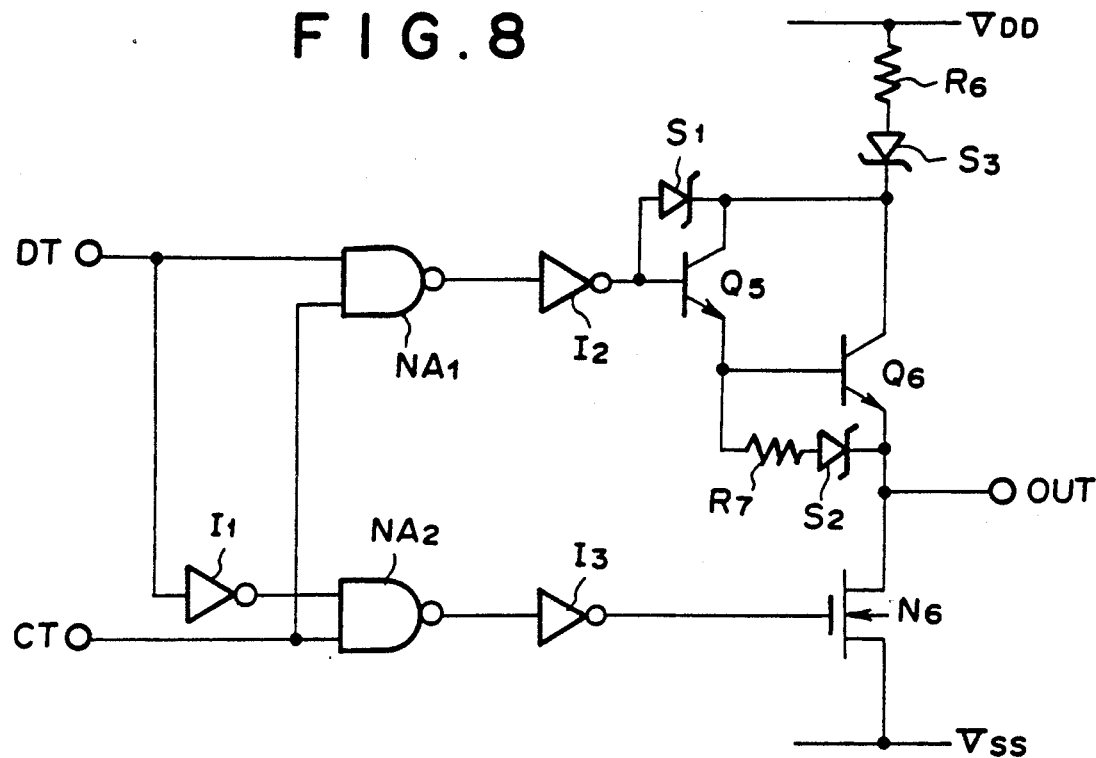
FIG. 8 is a circuit diagram of an output circuit of a BiCMOS integrated circuit device according to the present invention.

Next, the present invention is explained hereunder in detail with reference to FIG. 8 which illustrates a preferred embodiment of the present invention. The overall circuit shown in FIG. 8 functions as a three-state buffer circuit in the same way as the conventional circuits respectively shown in FIG. 1 and FIG. 2.

The main characterized feature of the embodiment according to the present invention is a combination of an NPN-type bipolar transistor $Q_6$ at the upper portion of the output circuit and an N-channel MOS transistor $N_6$ at the lower portion thereof. Thus, the upper bipolar transistor $Q_6$ and the lower MOS transistor $N_6$ together form an output circuit which has a push-pull configuration. It is to be noted that the number of elements is decreased as compared with that in the conventional circuit of FIG. 1 and, that the connection or disconnection of the circuit to the active bus line which was not possible in the CMOS output circuit has been made possible by the adoption of the bipolar transistor $Q_6$ at the push-side of the push-pull configuration.

More specifically, the bipolar/MOS hybrid output circuit of the invention, shown in FIG. 8, comprises Darlington-connected NPN-type bipolar transistors $Q_5$, $Q_6$ at the upper push-side and the N-channel MOS transistor $N_6$ at the lower pull-side. The Darlington-connection of the bipolar transistors $Q_5$, $Q_6$ facilitates a very fast operation of the output circuit. Collector currents to the Darlington-connected transistors $Q_5$, $Q_6$ are supplied from the upper power source line $V_{DD}$ through a series circuit of the resistor $R_6$ and a Schottky diode $S_3$. The Schottky diode $S_3$ functions effectively to prevent currents from flowing into the output circuit from the output node OUT at the time when the active connection or disconnection of the integrated circuit device to the active bus line is to be conducted. A Schottky clamping diode $S_1$ is connected across the base and the collector of the bipolar transistor $Q_5$ in order to prevent the output bipolar transistor $Q_6$ from being saturated. A series circuit composed of a resistor $R_7$ and a Schottky diode $S_2$ is connected across the base and the emitter of the output bipolar transistor $Q_6$, in order to discharge the charges stored in the base of the same transistor $Q_6$.

Conventionally, it was necessary for the MOS transistors at the output stage as described above to have a large gate width W in order to enhance the driving capability and therefore to have a large chip area for the elements involved. However, due to a remarkable advancement in the semiconductor manufacturing technology in recent years, the MOS transistor products with a small gate length L have become available and the tendency is that it is no longer necessary to make the gate width W so large as was the case before. Consequently, the reduction of necessary chip area when the circuit of FIG. 8 is compared with that of FIG. 1 on the basis of the same driving capability is in the order of 10-15%.

FIG. 8 also shows that, preceding the output stage described above, there is provided a preceding stage which is composed by a combination of the inverter circuits $I_1$-$I_3$ and the NAND gate circuits $NA_1$, $NA_2$. The preceding stage controls the ON/OFF of the Darlington-connected NPN-bipolar transistors $Q_5$, $Q_6$ and the N-channel MOS transistor $N_6$ of the output stage in accordance with the level of the signals applied to the input nodes DT and CT. By adjusting or controlling the respective gate widths Ws of the MOS transistors constituting the inverter circuits and the NAND circuits of the preceding stage, it is possible to control the ON/OFF timings of the bipolar transistors $Q_6$, $Q_5$ at the push-side and of the MOS transistor $N_6$ at the pull-side of the output stage.

The output circuit of the present invention proves a special advantage when it is used in an integrated circuit device of a master slice type such as a gate array. Since it is possible to adjust or control as desired the gate width W of each of the MOS transistors, it is possible to integrate on the same semiconductor substrate an output circuit which requires a larger driving capability and also an output circuit which, even without a great driving capability, accelerates a delay thereby improving the operating speed by reducing an input capacitance of the output N-channel MOS transistor $N_6$.

Figure 9:
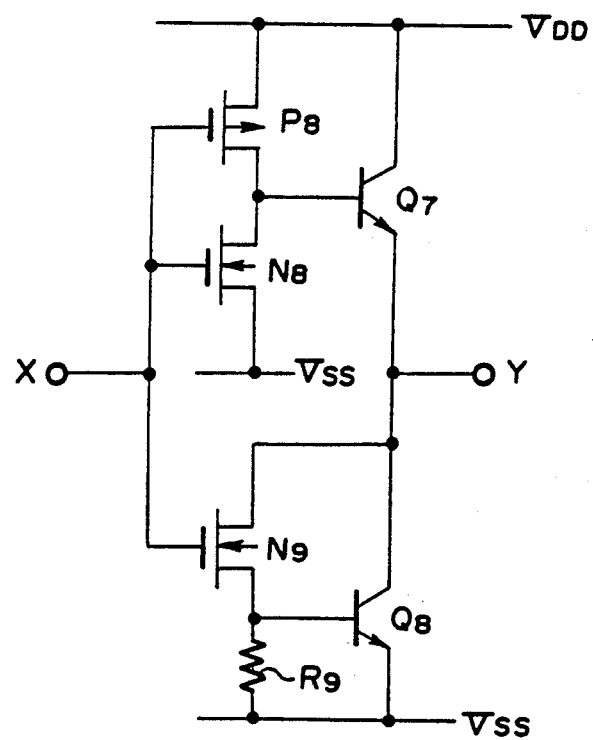
FIG. 9 is a circuit diagram of a BiCMOS or a bipolar/CMOS hybrid inverter.
Figure 10:
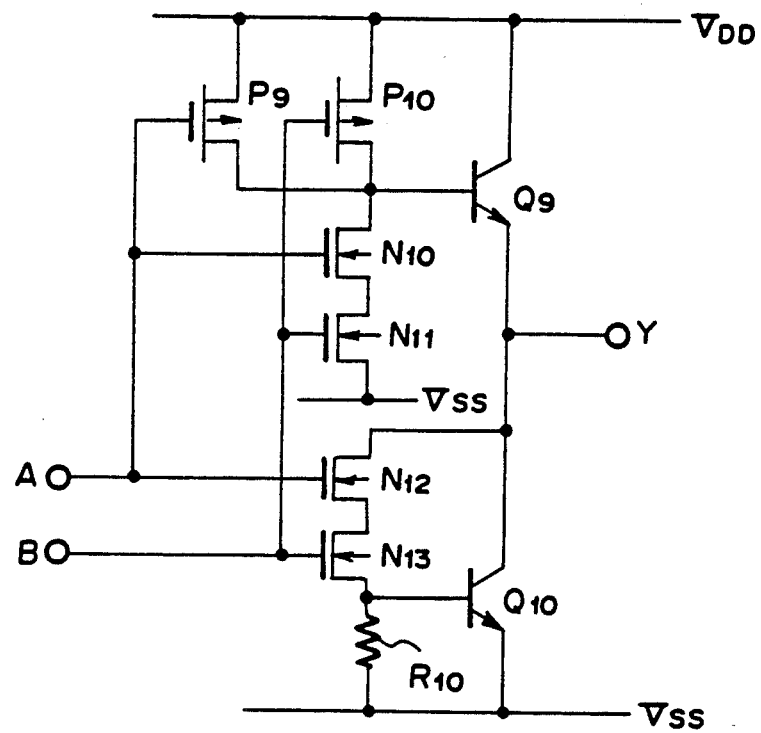
FIG. 10 is a circuit diagram of a BiCMOS or a bipolar/CMOS hybrid NAND gate circuit having two input nodes.

Instead of the CMOS inverter circuit shown in FIG. 3, a BiCMOS or bipolar/CMOS hybrid inverter circuit as shown in FIG. 9 may well be used as the inverters $I_1$-$I_3$ in FIG. 8. In the same manner, instead of the CMOS two-input NAND gate circuit shown in FIG. 4, a BiCMOS or bipolar/CMOS hybrid NAND gate circuit with two input nodes as shown in FIG. 10 may well be used as the necessary NAND gates $NA_1$, $NA_2$ in FIG. 8.

As explained above in detail, the output circuit according to the present invention is advantageous in that, in a BiCMOS integrated circuit device, its push-side uses a bipolar transistor and its pull-side uses a MOS transistor so that the number of elements required is reduced as compared with that in a conventional circuit and, that it has been made possible to carry out an active connection or disconnection of the circuit device to an active line which could not have been overcome in the conventional CMOS type output circuit. Also, when the output circuit according to the present invention is to be used in a gate array, it is possible to form as desired a variety of output circuits whose driving capabilities and delay times or operating speeds are different from one another.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor integrated circuit device including bipolar transistors and MOS transistors on a semiconductor substrate and having an output circuit formed in a push-pull configuration for performing a level shifting operation with respect to an external circuit, said output circuit comprising:
   a first power supply line of a first potential;
   a second power supply line of a second potential which is lower than said first potential;
   a first output bipolar transistor and a second bipolar transistor connected with each other in a Darlington configuration, said Darlington configuration being disposed at a push-side of said push-pull configuration between said first power supply line and an output node;
   a series circuit including a resistor and a Schottky diode, said series circuit being disposed between said first power supply lines and said Darlington-connected bipolar transistors for preventing the flow of currents from said output node;

a Schottky clamping diode connected across a base and a collector of said second bipolar transistor for preventing said first bipolar transistor from becoming saturated;

an output MOS transistor disposed at a pull-side of said push-pull configuration and between said output node and said second power supply line; and a control circuit for effecting an ON/OFF control of said Darlington-connected bipolar transistors and said output MOS transistor.

2. A semiconductor integrated circuit device according to claim 1, in which a series circuit having a resistor and a Schottky diode is connected across the base and the emitter of said first bipolar transistor for discharging the charges stored in the base of the same bipolar transistor.

3. A semiconductor integrated circuit device according to claim 1, in which both said first and second bipolar transistors are of NPN-type bipolar transistors and said output MOS transistor is of an N-channel MOS transistor.

4. A semiconductor integrated circuit device including bipolar transistors and MOS transistors on the same semiconductor substrate and having an output circuit formed of a push-pull configuration for performing a level shifting operation with respect to an external circuit, said output circuit comprising:

a first power supply line of a first potential;

a second power supply line of a second potential lower than said first potential;

a first output bipolar transistor and a second bipolar transistor Darlington-connected with each other, disposed at the push-side between said first power supply line and an output node;

a series circuit having a resistor and a Schottky diode, which circuit being disposed between said first power supply line and said Darlington-connected bipolar transistors for preventing the flow of currents from said output node;

a series circuit having a resistor and a Schottky diode connected across the base and the emitter of said first bipolar transistor for discharging the charges stored in the base of the same bipolar transistor;

a Schottky clamping diode connected across the base and the collector of said second bipolar transistor for preventing said first bipolar transistor from being saturated;

an output MOS transistor disposed at the pull-side between said output node and said second power supply line; and a control circuit for effecting the ON/OFF control of said output bipolar transistor and said output MOS transistor, said control circuit being composed of a logical circuit including first to third inverter circuits and first and second NAND gate circuits.

5. A semiconductor integrated circuit device according to claim 4, in which said inverter circuits and said NAND gate circuits are of CMOS-type circuits.

6. A semiconductor integrated circuit device according to claim 4, in which said inverter circuits and said NAND gate circuits are of BiCMOS or bipolar/CMOS hybrid circuits.

* * * * *